United States Patent [19]
Matsumura et al.

[11] Patent Number: 5,254,367
[45] Date of Patent: Oct. 19, 1993

[54] COATING METHOD AND APPARATUS

[75] Inventors: Kimiharu Matsumura, Kumamoto; Hiroyuki Sakai, Koshi, both of Japan

[73] Assignees: Tokyo Electron Limited, Tokyo; Tokyo Electron Kyushu Limited, Kumamoto, both of Japan

[21] Appl. No.: 865,766

[22] Filed: Apr. 10, 1992

Related U.S. Application Data

[63] Continuation of Ser. No. 549,411, Jul. 6, 1990, abandoned.

[30] Foreign Application Priority Data

Jul. 6, 1989 [JP] Japan .................... 1-175267

[51] Int. Cl.$^5$ .................................. B05D 3/12
[52] U.S. Cl. ........................ 427/240; 427/294; 427/377
[58] Field of Search ............... 427/240, 231, 377, 294

[56] References Cited

U.S. PATENT DOCUMENTS 4,492,718 1/1985 Mayer et al. ............... 427/240
5,013,586 5/1991 Cavazza ..................... 427/240

FOREIGN PATENT DOCUMENTS 56-113377 10/1981 Japan .
60-19339 2/1986 Japan .
62-176572 1/1988 Japan .

Primary Examiner—Janyce Bell
Attorney, Agent, or Firm—Oblon, Spivak, McClelland, Maier & Neustadt

[57] ABSTRACT

Coating method and apparatus. Said coating method comprises setting pressure in a chamber higher than the vapor pressure of a solvent mixed in a liquid which is coated on the surface of a matter to be processed, and dropping and spreading the coating liquid on the surface of the matter while rotating the matter by a predetermined number of rotation.

5 Claims, 2 Drawing Sheets

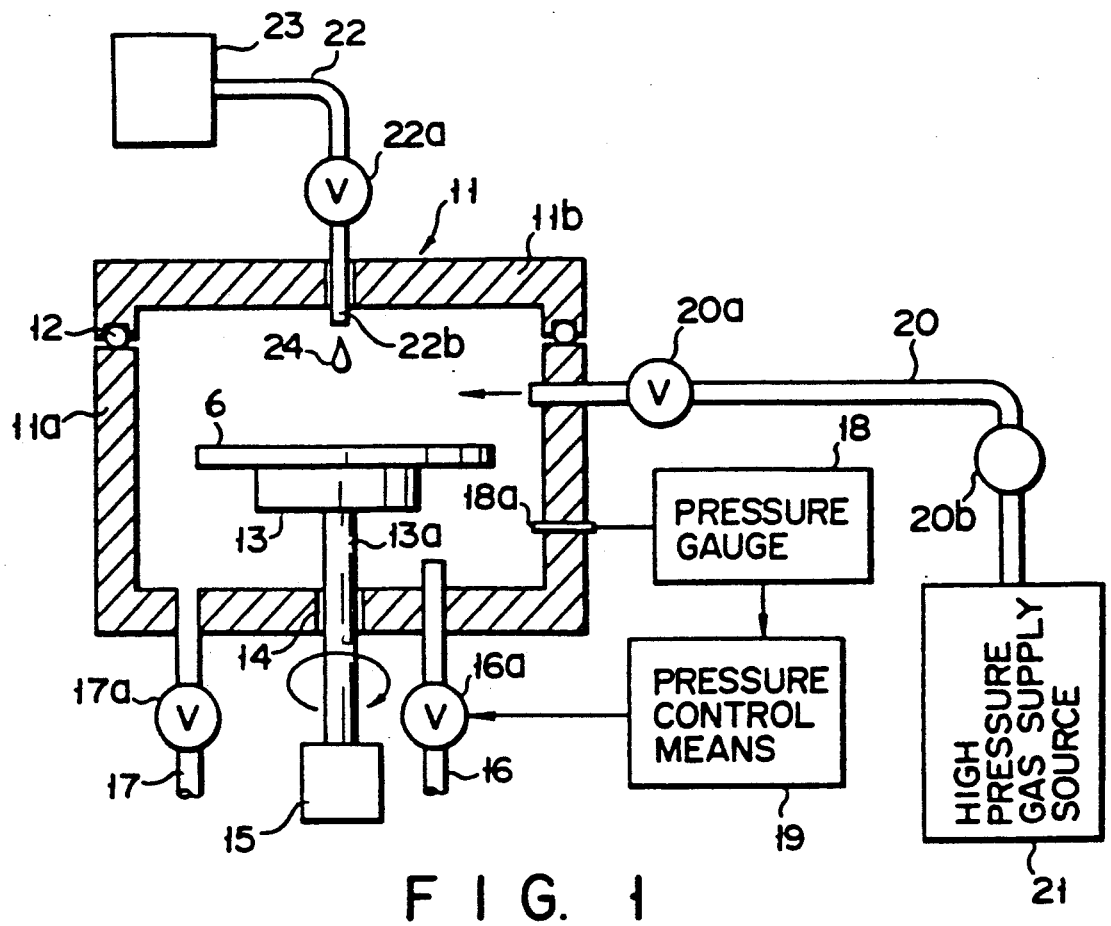
F I G. 1
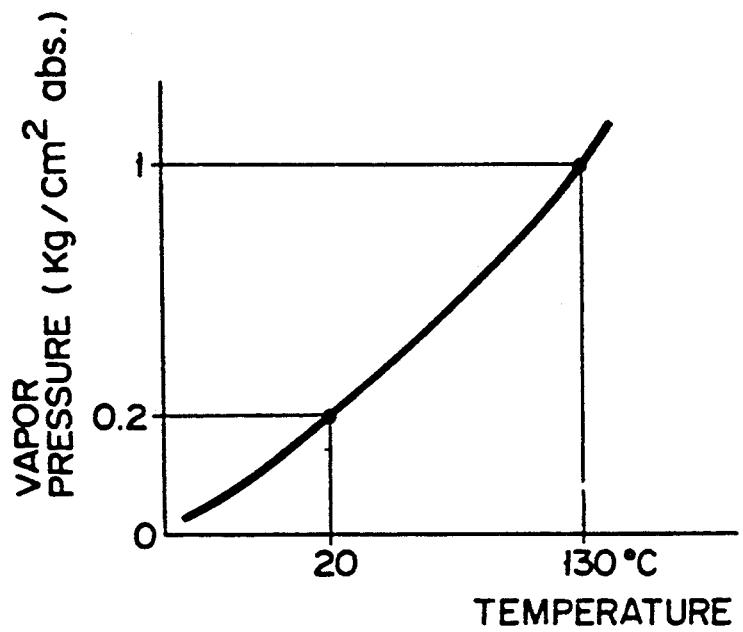
F I G. 2

COATING METHOD AND APPARATUS

This application is a continuation of application Ser. No. 07/549,411, filed on Jul. 6, 1990, now abandoned.

BACKGROUND OF THE INVENTION

1. Field of the Invention

The present invention relates to method and apparatus for coating material such as the resist onto a matter to be processed.

2. Description of the Related Art

The spin coating method is often employed for the resist-coating process in the course of manufacturing semiconductor devices. According to the spin coating method, a spin chuck 2 is rotatably housed in a spin cup 1 which is opened outside at the top thereof, as shown in FIG. 3. A matter or wafer 3 to be processed is sucked and fixed on the spin chuck 2. Resist 5 is dropped onto the wafer 3 through a nozzle 4 while rotating the spin chuck 2. The resist 5 on the wafer 3 is spread uniformly by centrifugal force to form a resist film 6 on the wafer 3.

Solvent is mixed in the resist 5 in this case to keep the resist viscous and the resist film 6 on the wafer 3 is hardened while causing the solvent to be volatilized.

The wafer 3 on which the resist film 6 has been formed is then carried to the next baking process.

According to this coating method, however, rotation speed at the center area of the wafer 3 is different from that at the circumferential area thereof. Therefore, the evaporation rate of the solvent in the resist 5 is different at the center and circumferential areas of the wafer 3. When the resist 5 dropped on the wafer 3 in the center thereof is spread toward the circumference thereof, the amount of the solvent contained in the resist 5 is changed by increasing evaporation rate of the solvent along the radius of the wafer 3 due to the increase of the rotation speed, thereby change the viscosity of the resist 5 in the correspondence with the distance from the center of the wafer 3. As shown in FIG. 4, therefore, the resist film 6 is hardened while leaving it thicker at the circumferential area of the wafer 3. As the result, the resist film 6 does not become uniform all over the wafer 3, thereby causing the productivity of semiconductor devices to be lowered.

SUMMARY OF THE INVENTION

The object of the present invention is therefore to provide coating method and apparatus capable of forming a predetermined film uniform in thickness all over a matter to be processed.

According to the present invention, there can be provided a method comprising rotating a matter which is housed and processed in a closed chamber by a predetermined number of rotation, setting pressure in the chamber higher than the vapor pressure of a solvent mixed in a liquid which is to be coated on the matter, and causing the coating liquid to be dropped and spread on the surface of the matter.

According to the present invention, there can also be provided an apparatus for carrying out the coating method comprising a spin chuck provided on the top thereof a table on which a matter to be processed is mounted, and freely rotatably housed in a closed chamber, a means provided with a nozzle in opposite to the table of the spin chuck and arranged in the closed chamber to supply coating liquid through the nozzle, a means for supplying predetermined high pressure gas into the chamber, a pressure gauge for measuring pressure in the chamber, an exhaust means attached to the chamber, a means attached to the exhaust means to adjust the amount of gas exhausted, and a pressure controller for controlling the adjuster means responsive to signal applied from the pressure gauge.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 shows an example of the coating apparatus according to the present invention;

FIG. 2 is a characteristic graph showing the relation of the vapor pressure of solvent relative to temperature;

DETAILED DESCRIPTION OF THE PREFERRED EMBODIMENT

Figure 3:
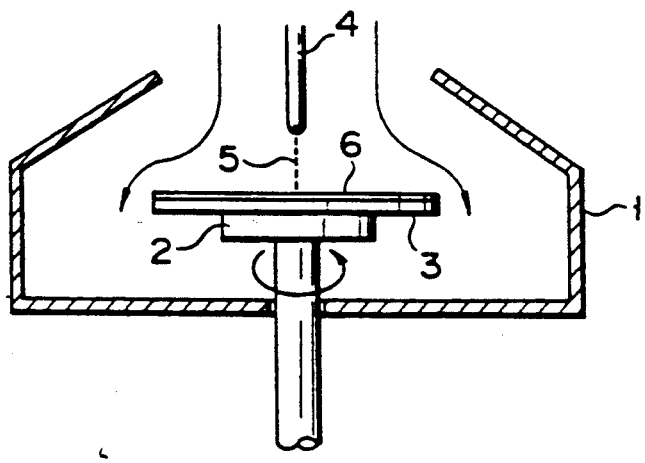
FIG. 3 shows the conventional coating apparatus.
Figure 4:
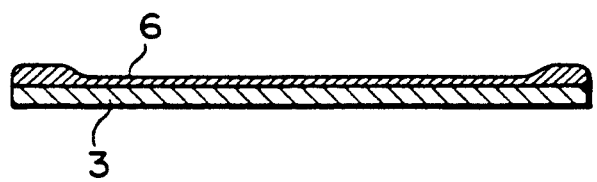
FIG. 4 is a sectional view showing a wafer on which resist film is formed non-uniform in thickness according to the conventional coating method.

FIG. 1 shows an example of the coating apparatus according to the present invention. Numeral reference 11 represents a closed chamber. The chamber 11 consists of a lower half 11a and an upper half 11b freely detachably attached to the top of the lower half 11a through an O-ring 12. A spin chuck 13 is freely rotatably arranged in the chamber 11.

A semiconductor wafer 6 to be processed is sucked and fixed onto the top of the spin chuck 13. One end of a rotating shaft 13a of the spin chuck 13 is projected outside the lower half 11a through a seal member 14 and a motor 15 for rotating the spin chuck 13 is attached to this outside end of the rotating shaft 13a.

Gas and liquid exhaust pipes 16 and 17 are connected to the bottom of the lower half 11a of the chamber 11. Valves 16a and 17a for controlling amounts of gas and liquid exhausted are attached to the pipes 16 and 17, respectively. A probe 18a of a pressure gauge 18 is inserted into the chamber 11 through a side wall of the lower half 11a to measure atmospheric pressure in the chamber 11. The pressure gauge 18 and the valve 16a are electrically connected to a pressure controller 19. One end of a high pressure gas supply pipe 20 is inserted into the chamber 11 through the side wall of the lower half 11a at a position higher than the pressure gauge 18, while the other end thereof is connected to a high pressure gas supply source 21. Pressure gauge and regulator 20a and 20b are attached to the supply pipe 20.

One end of a coating liquid supply pipe 22 is inserted into the chamber 11 through the top of the upper half 11b and opposed to the top of the spin chuck 13. A valve 22a for controlling the amount of coating liquid supplied is attached to the pipe 22. A coating liquid supply source 23 is connected to the other end of the supply pipe 22. Coating liquid such as resist 24 is dropped onto the semiconductor wafer 16 through a nozzle 22b of the supply pipe 22. The resist 24 is made viscous by solvent mixed therein and hardened as resist film when the solvent is volatilized. OFPR 800 made by Tokyo Ohka Corporation is used as the resist 24. TSMR 8900 made by the same corporation or S1400 made by Schupler Corporation can also be used. Ethyl cellosolve acetate (which will be hereinafter referred to as ECA) or Ethyllactate is used as the solvent.

The resist film is coated and formed as follows on the surface of the semiconductor wafer 16 (which will be hereinafter referred to as the wafer), for example, using the coating apparatus which is arranged as described above.

The wafer 6 is sucked and fixed on the top 13 of the spin chuck 13 in the chamber 11. The resist 24 is dropped onto the wafer 13 in the center thereof. Because the wafer 6 is being rotated by the motor 15 at this while, the resist 24 dropped is spread uniformly all over the surface of the wafer 16 by centrifugal force to coat a resist film thereon.

Pressure in the chamber 11 is made 1–10 kg/cm$^2$G (cm$^2$ Gauge), preferably 1–2 kg/cm$^2$G, which is far higher than the vapor pressure of ECA in the resist 24 during this spin coating process. The reason resides in that when the pressure in the chamber 11 is lower than 1 Kg/cm$^2$G, the volatilization of the solvent ECA in the resist 24 cannot be suppressed sufficiently and that when it is higher than 10 kg/cm$^2$G, the cost performance is maintaining the pressure of the chamber 11 to be high value become undesirable.

Further, the vapor pressure of ECA in the resist 24 is in a range of about 0.1–0.2 kg/cm$^2$ abs. under normal temperature, as apparent from the vapor pressure characteristic shown in FIG. 2. In other words, an amount of the solvent larger than it is imagined when the vapor pressure of ECA is in this range of about 0.1–0.2 kg/cm$^2$ escapes from the solvent 24 at the spin coating process. For example, partial pressure of ECA is 0.2 kg/cm$^2$ abs at 1 kg/cm$^2$ abs, and 0.07 kg/cm$^2$ abs at 3 kg/cm$^2$ abs. When the pressure in the chamber 11 is set high as described above, therefore, the vaporization of ECA can be suppressed throughout not to cause the resist 24 to be hardened. In short, no partial hardening is caused on the resist surface to keep the evaporation rate of the solvent certain. However large a diameter the wafer 16 may have, therefore, a resist film, uniform in thickness, can be formed all over the surface of the wafer 16.

As described above, the pressure in the chamber 11 may be set to such a range as can suppress the vaporization of the solvent and respond to the vapor pressure of it.

When pressure is kept higher than atmospheric pressure at the area around the wafer 16 during the spin coating process, the vaporization of the solvent from the surface of the resist 24 can be suppressed throughout from the center of the wafer 16 to the circumference thereof. This enables the film thickness of the resist 24 to be made uniform all over the surface of the wafer 16. As the result, the productivity of semiconductor devices can be remarkably enhanced.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A coating method, comprising the steps of:
   preparing a chamber surrounding a substrate, means for supplying a gas into the chamber, means for exhausting a gas from the chamber, means for detecting the inner pressure of the chamber, pressure control means for controlling the inner pressure of the chamber, means for spin-rotating the substrate, and means for applying a liquid including a solvent;
   determining a vapor pressure of the solvent at a coating processing temperature based on the relationship between the temperature and the vapor pressure obtained before the preparing step;
   supplying the determined vapor pressure data to the pressure control means;
   supplying a pressurized gas into the chamber by using the gas supply means;
   exhausting the gas from the chamber by using the exhausting means;
   detecting the inner pressure of the chamber by using the pressure detecting means;
   controlling the exhausting means by using the pressure control means based on the detected pressure and said vapor pressure of the solvent at the coating process temperature so as to keep the inner pressure of the chamber higher than said vapor pressure, whereby generating a gas stream around the substrate in the chamber by exhausting the chamber, while supplying the pressurized gas thereto;
   spin-rotating the substrate by using the spin-rotating means; and
   applying the liquid to the substrate by using the liquid applying means, while the substrate is rotated.

2. The coating method according to claim 1, wherein the solvent is ethyl cellosolve acetate or ethyllactate.

3. The coating method according to claim 1, further comprising the step of:
   exhausting a waste gas containing a resist solution in a mist state, from within the chamber by using the exhausting means while discharging a waste liquid from within the chamber by using drain means.

4. The coating method according to claim 1, wherein a pressurized gas of 1 to 10 kg/cm$^2$ is supplied into the chamber by using the gas supply means.

5. The coating method according to claim 1, wherein a pressurized gas of 1 to 2 kg/cm$^2$ is supplied into the chamber by using the gas supply means.

* * * * *